US011687283B2

(12) United States Patent
Walker

(10) Patent No.: US 11,687,283 B2
(45) Date of Patent: *Jun. 27, 2023

(54) MEMORY MODULE INTERFACES

(71) Applicant: Micron Technology, Inc., Boise, ID (US)

(72) Inventor: Robert M. Walker, Raleigh, NC (US)

(73) Assignee: Micron Technology, Inc., Boise, ID (US)

(*) Notice: Subject to any disclaimer, the term of this patent is extended or adjusted under 35 U.S.C. 154(b) by 46 days.

This patent is subject to a terminal disclaimer.

(21) Appl. No.: 17/306,566

(22) Filed: May 3, 2021

(65) Prior Publication Data
US 2021/0255806 A1 Aug. 19, 2021

Related U.S. Application Data

(63) Continuation of application No. 16/225,559, filed on Dec. 19, 2018, now Pat. No. 10,996,890.

(51) Int. Cl.
*G11C 7/10* (2006.01)
*G06F 3/06* (2006.01)
*G06F 13/42* (2006.01)

(52) U.S. Cl.
CPC .......... *G06F 3/0659* (2013.01); *G06F 3/061* (2013.01); *G06F 3/0688* (2013.01); *G06F 13/4282* (2013.01); *G11C 7/1003* (2013.01)

(58) Field of Classification Search
CPC ..... G11C 7/1003; Y02D 10/00; G06F 3/0659; G06F 3/061; G06F 3/0688;
(Continued)

(56) References Cited

U.S. PATENT DOCUMENTS 6,681,301 B1 * 1/2004 Mehta ................ G06F 13/1694
365/194
7,162,567 B2 1/2007 Jeddeloh
(Continued)

FOREIGN PATENT DOCUMENTS

KR 10-2018-0021950 3/2018

OTHER PUBLICATIONS

International Search Report and Written Opinion for related PCT Application No. PCT/US2019/063364, dated Mar. 23, 2020, 12 pages.
(Continued)

*Primary Examiner* — Khamdan N. Alrobaie
(74) *Attorney, Agent, or Firm* — Brooks, Cameron & Huebsch, PLLC

(57) ABSTRACT

The present disclosure includes apparatuses and methods related to memory module interfaces. A memory module, which may include volatile memory or nonvolatile memory, or both, may be configured to communicate with a host device via one interface and to communicate with another memory module using a different interface. Memory modules may thus be added or removed from a system without impacting a PCB-based bus to the host, and memory modules may communicate with one another without accessing a bus to the host. The host interface may be configured according to one protocol or standard, and other interfaces between memory modules may be configured according to other protocols or standards.

19 Claims, 8 Drawing Sheets

(58) Field of Classification Search
CPC .. G06F 13/4282; G06F 3/0607; G06F 3/0635; G06F 13/1684; G06F 13/4022; G06F 13/4256; G06F 13/387; G06F 13/1694; G06F 13/409

See application file for complete search history.

(56) References Cited

U.S. PATENT DOCUMENTS

| | | |
|---|---|---|
| 7,350,048 B1 | 3/2008 | Schulz |
| 8,700,830 B2 | 4/2014 | Hasan et al. |
| 9,135,190 B1 | 9/2015 | Bruce et al. |
| 9,411,719 B2 | 8/2016 | Park |
| 9,496,018 B2 | 11/2016 | Debrosse et al. |
| 9,817,610 B1 | 11/2017 | Shallal et al. |
| 10,241,686 B2 | 3/2019 | Kondou et al. |
| 2002/0112119 A1* | 8/2002 | Halbert ............... G06F 13/1694 711/115 |
| 2006/0294295 A1* | 12/2006 | Fukuzo ............... G06F 13/1673 711/105 |
| 2009/0019184 A1 | 1/2009 | Skerlj et al. |
| 2009/0046533 A1 | 2/2009 | Jo |
| 2013/0159616 A1 | 6/2013 | Xu |
| 2014/0362630 A1 | 12/2014 | Vogt |
| 2015/0178243 A1* | 6/2015 | Lowery ............... G06F 12/0692 709/212 |
| 2015/0261446 A1 | 9/2015 | Lee et al. |
| 2015/0261698 A1* | 9/2015 | Zhang ................ G11C 7/1003 711/156 |
| 2016/0239233 A1 | 8/2016 | Haywood |
| 2016/0378344 A1 | 12/2016 | Nachimuthu et al. |
| 2017/0255383 A1 | 9/2017 | Chang et al. |
| 2017/0285992 A1 | 10/2017 | Vogt et al. |
| 2017/0286354 A1 | 10/2017 | Feehrer et al. |
| 2018/0052601 A1 | 2/2018 | Lee |
| 2018/0059945 A1 | 3/2018 | Helmick et al. |
| 2019/0035439 A1 | 1/2019 | Takahashi et al. |
| 2019/0221273 A1* | 7/2019 | Parkinson ........... G06F 12/0246 |
| 2020/0097208 A1 | 3/2020 | Ross |

OTHER PUBLICATIONS

Ma, et al., "Key and Difficult Points and Refined Solutions of Typical Problems regarding Microcomputer Principle and Interface Technology", Xi'an Jiaotong University Press, Aug. 31, 2002, 4 pages.

Chen, et al., "Electronic CAD", Tianjin Science and Technology Press, Aug. 31, 2018, 5 pages.

Office Action from related China Patent Application No. 201980083199.X, dated Nov. 23, 2021.

Yu, et al., "English Chinese Dictionary of Modern Interface Technology", Apr. 30, 1992, 3 pages.

Second Office Action from related China Patent Application No. 201980083199, dated May 19, 2022, 24 pages.

* cited by examiner

MEMORY MODULE INTERFACES

PRIORITY INFORMATION

This application is a Continuation of U.S. application Ser. No. 16/225,559, filed Dec. 19, 2018, which issues as U.S. Pat. No. 10,996,890 on May 4, 2021, the contents of which are included herein by reference.

TECHNICAL FIELD

The present disclosure relates generally to memory devices, and more particularly, to apparatuses and methods for memory module interfaces.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Memory can be part of a memory module (e.g., a dual in-line memory module (DIMM)) used in computing devices. Memory modules can include volatile, such as DRAM, for example, and/or non-volatile memory, such as Flash memory or RRAM, for example. The DIMMs can be using a main memory in computing systems.

DETAILED DESCRIPTION

Figure 1:
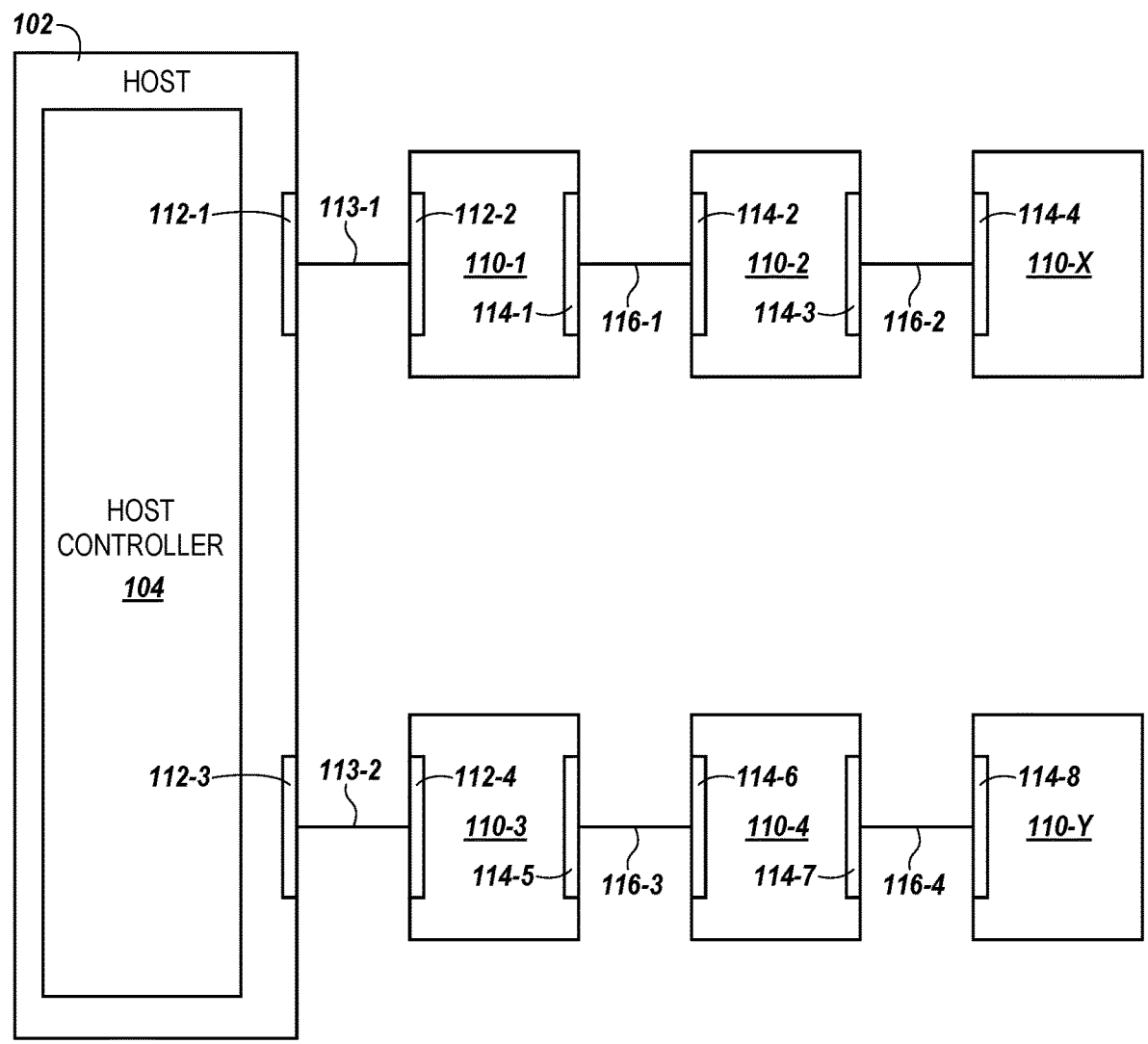
FIG. 1 is a block diagram of an apparatus in the form of a computing system including a memory system in accordance with a number of embodiments of the present disclosure.

The present disclosure includes apparatuses and methods related to memory module interfaces. An example apparatus can include a first interface coupled to a host; and a second interface coupled to a memory module, wherein the apparatus is configured to transfer data between the host and the apparatus via the first interface and to transfer data between the memory module and the apparatus via the second interface.

In a number of embodiments, a first DIMM can be coupled to a host via a first interface. The first interface can be coupled to a printed circuitry board. The first DIMM can be coupled to a number of other DIMMs via a second interface. The host can communicate to the number of other DIMMs through the first DIMM via the first interface. The first DIMM can include a controller to execute commands from the host and/or to send commands and/or data to the number of other DIMMs coupled to the first DIMM on the second interface.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that a number of the particular feature so designated can be included with a number of embodiments of the present disclosure.

As used herein, "a number of" something can refer to one or more of such things. For example, a number of memory devices can refer to one or more of memory devices. Additionally, designators such as "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a block diagram of an apparatus in the form of a computing system including a memory system in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In the embodiment illustrated in FIG. 1, a memory system can include one or more memory modules, such as memory modules 110-1, . . . , 110-X, 110-Y, for example. Memory modules 110-1, . . . , 110-X, 110-Y can be dual in-line memory modules (DIMM) and can include volatile memory, such as DRAM, and/or non-volatile memory, such as storage class memory and/or 3D X-point memory, among other types of memory. Memory systems can include any type of memory device, such as DIMMs with memory. In a number of embodiments, a memory system can include a multi-chip device. A multi-chip device can include a number of different memory types and/or memory modules. For example, a memory system can include non-volatile or volatile memory on any type of a module. The examples described below in association with FIGS. 1-5 use a DIMM as the memory module, but the protocol of the present disclosure can be used on any memory system.

In FIG. 1, a memory system includes host 102 coupled to DIMM 110-1 via a channel including bus 113-1, interface A 112-1, and interface A 112-2. DIMM 110-1 is coupled to DIMMs 110-2 and 110-X and DIMM 110-1 can be coupled to additional DIMMs or other memory modules and/or devices that are not shown in FIG. 1. DIMMs 110-1, 110-2, and 110-X are coupled together and are configured to transfer commands and/or data between each other. In FIG. 1, DIMM 110-1 is coupled to DIMM 110-2 via bus 116-1, interface B 114-1, and interface B 114-2. DIMM 110-2 is coupled to DIMM 110-X via bus 116-2, interface B 114-3 and interface B 114-4. Interfaces A 112-1, 112-2, 112-3, and 112-4 can be used to couple host 102 to a DIMM (e.g., DIMMs 110-1 and 110-3 in FIG. 1). Interfaces B 114-1, . . . , 114-8 can be used to coupled DIMMs 110-1, . . . , 110-X, 110-Y to each other. Interface A can be a same type of interface as interface B; and interface A can be a different type of interface as Interface B. Interface A can be an NVDIMM interface that allows for non-deterministic execution of the commands. Interface B can be a parallel, a serial, and/or a multiple serial interface, for example. The type of interface for interface A and/or interface B can be dependent on the type of memory module and/or the type of memory devices on the memory module. For example, DIMM 110-1 can include interface A 112-2 that is an NVDIMM interface to communicate with host 102, where host 102 includes interface A 112-1 that is also in an NVDIMM interface. DIMM 110-1 can include interface B 114-1 that is an DDR5 interface to communicate with DIMM 110-2, where DIMM 110-2 is a DDR DIMM and includes interface B 114-2 that is a DDR5 interface. DIMM 110-2 can include interface B 114-3 that is a storage class memory interface to communicate with DIMM 110-X, where DIMM 110-X is a DIMM that includes storage class memory and interface B 114-4 is a storage class memory interface.

DIMMs 110-1 and 110-2 can be configured to received commands from host 102 via interface A 112-2 and interface A 112-4, respectively. DIMMs 110-1 and 110-2 can be configured to execute the commands by transferring data between DIMMs 110-1, . . . , 110-X, 110-Y via interfaces B 114-1, . . . , 114-8 and between host 102 and DIMMs 110-1 and 110-2 via interface A 112-2 and interface A 112-4, respectively. The DIMMs can be configured to transfer data between DIMMs 110-1, . . . , 110-X, 110-Y via interfaces B 114-1, . . . , 114-8 while transferring data between host 102 and DIMMs 110-1 and 110-2 via interface A 112-2 and interface A 112-4, respectively.

In FIG. 1, a memory system includes host 102 coupled to DIMM 110-3 via a channel including bus 113-2, interface A 112-3, and interface A 112-4. DIMM 110-3 is coupled to DIMM 110-4 and 110-Y and DIMM 110-1 can be coupled to additional DIMMs or other memory modules and/or devices that are not shown in FIG. 1. DIMMs 110-3, 110-4, and 110-Y are coupled together and are configured to transfer commands and/or data between each other. In FIG. 1, DIMM 110-3 is coupled to DIMM 110-4 via bus 116-3, interface B 114-5, and interface B 114-6. DIMM 110-4 is coupled to DIMM 110-Y via bus 116-4, interface B 114-7 and interface B 114-8.

In a number of embodiments each of DIMMs 110-1, . . . , 110-X, 110-Y can include a controller, such as a memory system controller. In a number of embodiments, at least one of the DIMMs 110-1, . . . , 110-X that are coupled together can include a controller, such as a memory system controller; and at least one of the DIMMs 110-3, . . . , 110-Y that are coupled together can include a controller, such as a memory system controller. A memory system controller will be described below in association with FIGS. 3A-5. A controller on DIMMs 110-1, . . . , 110-X, 110-Y can receive commands from host 102 and control execution of the commands on a DIMM. Also, in a number of embodiments, the protocol of the present disclosure could be implemented by a memory device on a DIMM (e.g., a DIMM) without a controller and execution of the commands using the protocol of the present disclosure could be built into the memory device.

The host 102 can send commands to the DIMMs 110-1, . . . , 110-X, 110-Y using the protocol that is dependent on the type of memory in the DIMMs. For example, the host can use an NVDIMM-P protocol to communicate on the same channel with an NVDIMM-P DIMM and a DDR5 protocol to communicate with a DRAM DIMM that are coupled together.

As illustrated in FIG. 1, a host 102 can be coupled to DIMMs 110-1, . . . , 110-X, 110-Y. Ina number of embodiments, DIMMs 110-1, . . . , 110-X, can be coupled to host 102 via a channel that includes interface A 112-1 and 112-2, bus 113-1, interface B 114-1, . . . , 114-4, and bus 116-1 and 116-2. DIMMs 110-3, . . . , 110-Y, can be coupled to host 102 via a channel that includes interface A 112-3 and 112-4, bus 113-2, interface B 114-5, . . . , 114-8, and bus 116-3 and 116-4. Host 102 can be a laptop computer, personal computers, digital camera, digital recording and playback device, mobile telephone, PDA, memory card reader, interface hub, among other host systems, and can include a memory access device, e.g., a processor. One of ordinary skill in the art will appreciate that "a processor" can intend one or more processors, such as a parallel processing system, a number of coprocessors, a processing resource, etc.

Host 102 includes a host controller 104 to communicate with a memory system. The host controller 104 can send commands to the DIMMs 110-1, . . . , 110-X, 110-Y. The host controller 104 can communicate with the DIMMs 110-1, . . . , 110-X, 110-Y and/or a controller on each of the DIMMs 110-1, . . . , 110-X, 110-Y to read, write, and erase data, among other operations. An interface (e.g., interface A 112) can provide an interface for passing control, address, data, and other signals between a DIMM (e.g., DIMMs 110-1, . . . , 110-X, 110-Y) and host 102 having compatible receptors for the interface. The signals can be communicated between host 102 and DIMMs 110-1, . . . , 110-X, 110-Y on a number of buses (e.g., bus 113-1 and 113-2), such as a data bus and/or an address bus, for example, via a number of channels. An interface (e.g., interface B 114) can provide an interface for passing control, address, data, and other signals between DIMMs (e.g., DIMMs 110-1, . . . , 110-X, 110-Y) having compatible receptors for the interface. The signals can be communicated between DIMMs 110-1, . . . , 110-X, 110-Y on a number of buses (e.g., bus 116-1, . . . , 116-4), such as a data bus and/or an address bus, for example, via a number of channels.

The host controller 104 and/or a controller on a DIMM can include control circuitry, e.g., hardware, firmware, and/or software. In one or more embodiments, the host controller 108 and/or a controller on a DIMM can be an application specific integrated circuit (ASIC) coupled to a printed circuit board including a physical interface. Also, each DIMM 110-1, . . . , 110-X, 110-Y can include buffers of volatile and/or non-volatile memory and registers. Buffers can be used to buffer data that is used during execution of read commands and/or write commands.

The DIMMs 110-1, . . . , 110-X, 110-Y can provide main memory for the memory system or could be used as additional memory or storage throughout the memory system. Each DIMM 110-1, . . . , 110-X, 110-Y can include a number of memory devices each having one or more arrays of memory cells, (e.g., volatile and/or non-volatile memory cells). The arrays can be flash arrays with a NAND architecture, for example. Embodiments are not limited to a particular type of memory device. For instance, the memory device can include RAM, ROM, DRAM, SDRAM, PCRAM, RRAM, 3D X-Point, and flash memory, among others.

The embodiment of FIG. 1 can include additional circuitry that is not illustrated so as not to obscure embodiments of the present disclosure. For example, the memory system can include address circuitry to latch address signals provided over I/O connections through I/O circuitry. Address signals can be received and decoded by a row decoder and a column decoder to access the DIMMs 110-1, . . . , 110-X, 110-Y. It will be appreciated by those skilled in the art that the number of address input connections can depend on the density and architecture of the DIMMs 110-1, . . . , 110-X, 110-Y.

Figure 2A:
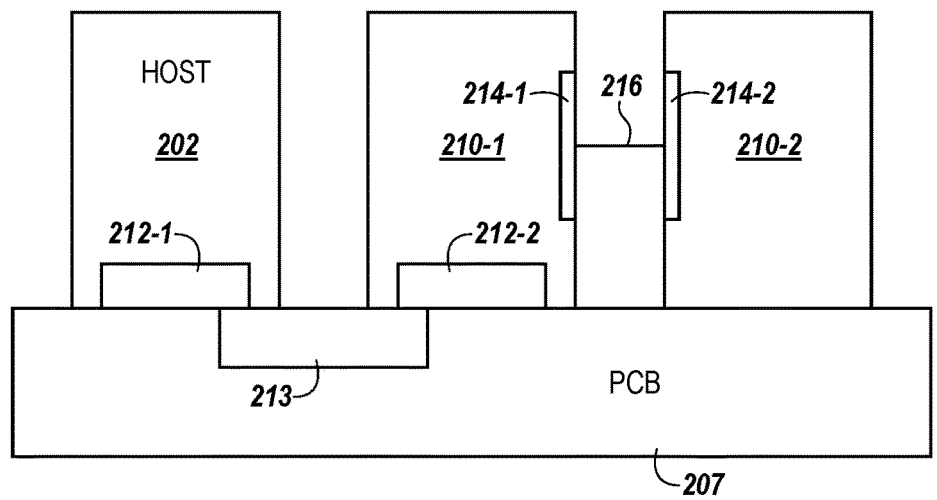
FIGS. 2A and 2B is a block diagram of an apparatus in the form of a computing system including at least a portion of a memory system on a printed circuit board (PCB) in accordance with a number of embodiments of the present disclosure.
Figure 2B:
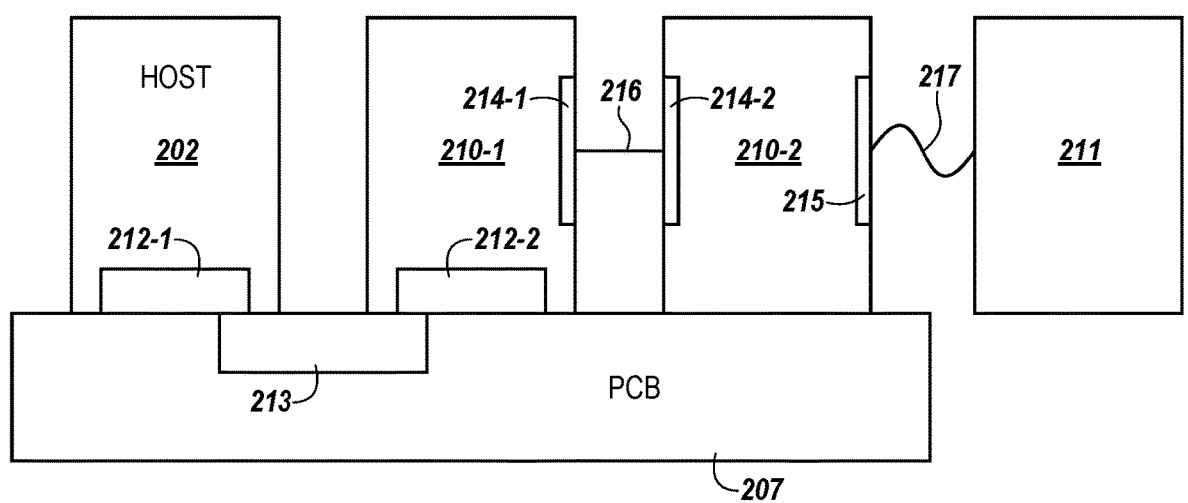

FIGS. 2A and 2B is a block diagram of an apparatus in the form of a computing system including at least a portion of a memory system on a printed circuit board (PCB) in accordance with a number of embodiments of the present disclosure. In FIG. 2A, host 202, DIMM 210-1, and DIMM 210-2 are formed on PCB 207. Host 202 is coupled to DIMM 210-1 via interface A 212-1, interface A 212-2, and bus 213. Bus 213 is formed in PCB 207. Host 202 can send commands and/or data to DIMM 210-1 and DIMM 210-2 on bus 213. DIMM 210-1 is coupled to DIMM 210-2 via interface B 214-1, interface B 214-2, and bus 216. Commands and/or data from host 202, DIMM 210-1, and/or DIMM 210-2 can be transferred between DIMM 210-1 and 210-2 via interface B 214-1, interface B 214-2, and bus 216.

DIMM 210-1 and 210-2 can receive power and ground signals via connection points on the PCB 207. DIMM 210-2 can received commands and/or data on bus 216, which is off PCB 207. A number of DIMMs can be coupled together via buses (e.g., bus 216) and interfaces (e.g., interface B 214) that are not on (e.g., off) the PCB 207. This allows a number of DIMMs to be coupled together and not be constrained by the physical limitations of using connections points on PCB 207. DIMM 210-2 can be coupled to DIMM 210-1 and/or PCB 207. In a number of embodiments, bus 216 that couples DIMM 210-1 to DIMM 210-2 can be located on PCB 207.

Commands and/or data can be transferred between host 202 and DIMM 210-1 on bus 213 while commands and/or data is transferred between DIMM 210-1 and DIMM 210-2 on bus 216. Bus 213 and bus 216 can be controlled independently of each other. Also, DIMM 210-1 can be configured to transfer commands and/or data from host 202 that are intended for DIMM 210-2 to DIMM 210-2 and DIMM 210-1 can be configured to transfer commands and/or data from DIMM 210-2 that are intended for host 202 to host 202. DIMM 210-1 can receive commands from host 202 for DIMM 210-2 and, in response to receiving the commands from host 202, DIMM 210-1 can generate commands based on the commands from host 202 and send the commands generated by DIMM 210-1 to DIMM 210-2 for execution by DIMM 210-2. DIMM 210-1 and/or DIMM 210-2 can also generate commands, without input from host, to send to DIMM 210-1 and/or DIMM 210-2, for execution by DIMM 210-1 and/or DIMM 210-2.

In FIG. 2B, host 202, DIMM 210-1, and DIMM 210-2 are coupled to PCB 207 and solid state drive (SSD) 211 is coupled to DIMM 210-2. SSD 211 is not coupled to PCB 207. Host 202 is coupled to DIMM 210-1 via interface A 212-1, interface A 212-2, and bus 213. Bus 213 is at least partially located on PCB 207. Host 202 can send commands and/or data to DIMM 210-1 and DIMM 210-2 on bus 213. DIMM 210-1 is coupled to DIMM 210-2 via interface B 214-1, interface B 214-2, and bus 216. SSD 211 is coupled to DIMM 210-2 via interface C 215 and bus 217. Commands and/or data from host 202, DIMM 210-1, DIMM 210-2, and/or SSD 211 can be transferred between DIMM 210-1 and 210-2 via interface B 214-1, interface B 214-2, and bus 216 and/or between DIMM 210-1 and SSD 211 via interface C 215 and bus 217. DIMMs 210-1 and DIMM 210-2 can receive commands from host 202 for execution on DIMM 210-2 and/or SSD 211 and, in response to receiving the commands from host 202, DIMMs 210-1 and/or 210-2 can generate commands based on the commands from host 202 and send the commands generated by DIMMs 210-1 and/or 210-2 to DIMM 210-2 and/or SSD 211 for execution by DIMM 210-2 and SSD 211. DIMM 210-1 and/or DIMM 210-2 can also generate commands, without input from host, to send to DIMM 210-1, DIMM 210-2, and/or SSD 211 for execution by DIMM 210-1, DIMM 210-2, and/or SSD 211.

DIMM 210-1 and 210-2 can receive power and ground signals via connection points on the PCB 207. DIMM 210-2 can received commands and/or data on bus 216, which is off PCB 207. A number of DIMMs can be coupled together via buses (e.g., bus 216) and interfaces (e.g., interface B 214) that are not on the PCB 207. DIMMS can be coupled to other memory devices (e.g., SSD 211) that are also not on PCB 207. This allows a number of DIMMs and memory devices to be coupled together and not be constrained by the physical limitations of using connections points on PCB 207. In a number of embodiments, bus 217 and SSD 211 can be located on PCB 207.

Figure 3A:
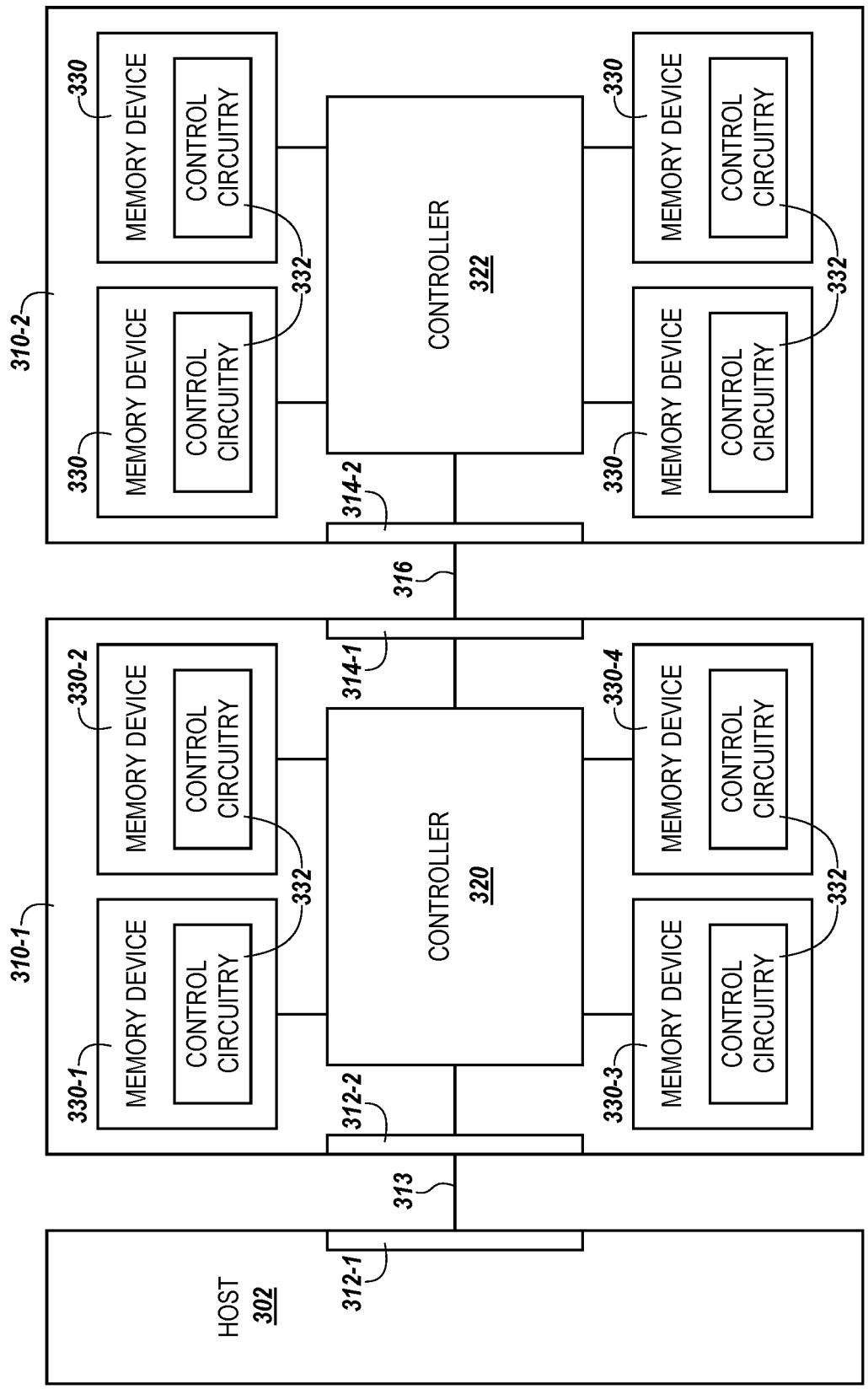
FIGS. 3A and 3B is a block diagram of an apparatus in the form of a computing system including a memory system having a memory module with a memory system controller in accordance with a number of embodiments of the present disclosure.
Figure 3B:
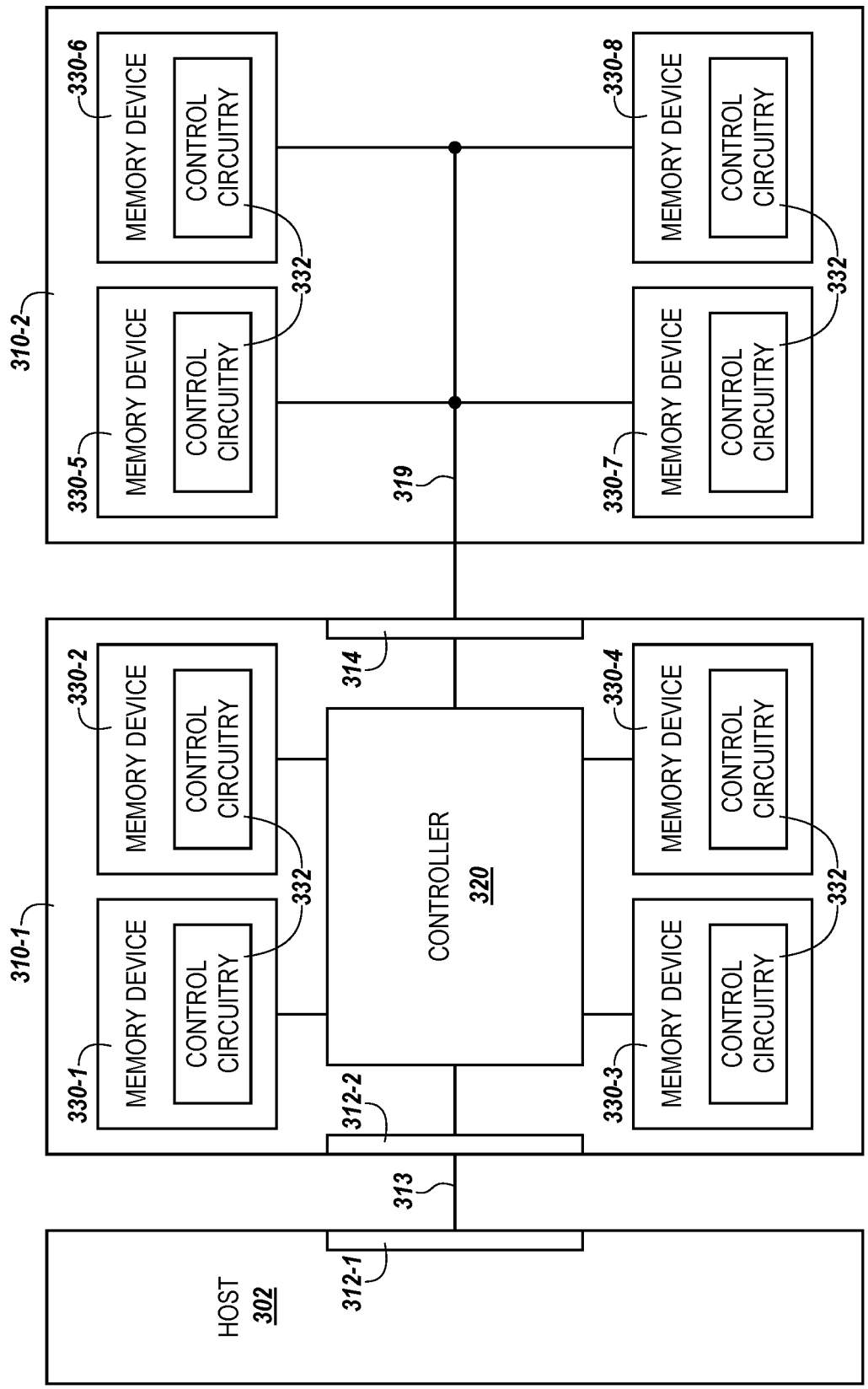

FIGS. 3A and 3B is a block diagram of an apparatus in the form of a computing system including a memory system having a memory module with a memory system controller in accordance with a number of embodiments of the present disclosure. In FIG. 3A, host 302 is coupled to DIMM 310-1 via interface A 312-1, interface A 312-2, and bus 313. DIMM 310-1 includes controller 320 coupled to interface A 312-2. MINIM 310-1 includes memory devices 330-1, . . . , 330-4 coupled to controller 320. Memory devices 330-1, . . . , 330-4 can include non-volatile memory arrays and/or volatile memory arrays. Memory devices 330-1, ..., 330-4 can include control circuitry 332 (e.g., hardware, firmware, and/or software) which can be used to execute commands on the memory devices 330-1, ..., 330-4. Control circuitry 332 can receive commands from controller 320. Control circuitry 332 can be configured to execute commands to read and/or write data in the memory devices 330-1, ..., 330-4. For example, DIMM 310-1 can be an NVDIMM with memory devices 330-1 and 330-2 that include DRAM and memory devices 330-3 and 330-4 that include 3D X-Point memory.

DIMM 310-1 is coupled to DIMM 310-2 via interface B 314-1, interface B 314-2, and bus 316. DIMM 310-2 includes controller 322 coupled to interface B 314-2. DIMM 310-2 includes memory devices 330-5, ..., 330-8 coupled to controller 322. Memory devices 330-5, ..., 330-8 can include non-volatile memory arrays and/or volatile memory arrays. Memory devices 330-5, ..., 330-8 can include control circuitry 332 (e.g., hardware, firmware, and/or software) which can be used to execute commands on the memory devices 330-5, ..., 330-8. Control circuitry 332 can receive commands from controller 320. Control circuitry 332 can be configured to execute commands to read and/or write data in the memory devices 330-5, ..., 330-8. For example, memory devices 330-5, ..., 330-8 can include storage class memory.

Controller 320 on DIMM 310-1 can be a memory system controller. A memory system controller can receive commands and/or data and determine where to send the commands and/or data. Controller 320 can receive commands from host 302 and/or DIMM 310-2 and determine that the commands are to be executed by DIMM 310-1. Controller 320 can control execution of the commands in response to determining the commands are to be executed by DIMM 310-1. Controller 320 can receive commands from host 302 and determine that the commands are to be executed by DIMM 310-2. Controller 320 can transfer the commands to DIMM 310-2 in response to determining the commands are to be executed by DIMM 310-2. Controller 320 can receive data from DIMM 310-2 from host 302 and determine that the data is to be stored on DIMM 310-2. Controller 320 can cause the data to be written DIMM 310-2 in response to determining the data is to be stored on DIMM 310-1. Controller 320 can receive data from DIMM 310-2 from host 302 and determine that the data is to be sent to host 302. Controller 320 can send the data to host 302 in response to determining the data is to be sent to host 302.

In FIG. 3B, host 302 is coupled to DIMM 310-1 via interface A 312-1, interface A 312-2, and bus 313. DIMM 310-1 includes controller 320 coupled to interface A 312-2. MINIM 310-1 includes memory devices 330-1, ..., 330-4 coupled to controller 320. Memory devices 330-1, ..., 330-4 can include non-volatile memory arrays and/or volatile memory arrays. Memory devices 330-1, ..., 330-4 can include control circuitry 332 (e.g., hardware, firmware, and/or software) which can be used to execute commands on the memory devices 330-1, ..., 330-4. Control circuitry 332 can receive commands from controller 320. Control circuitry 332 can be configured to execute commands to read and/or write data in the memory devices 330-1, ..., 330-4. For example, DIMM 310-1 can be an NVDIMM with memory devices 330-1 and 330-2 that include DRAM and memory devices 330-3 and 330-4 that include 3D X-Point memory.

DIMM 310-1 is coupled to DIMM 310-2 via bus 319. DIMM 310-2 includes memory devices 330-5, ..., 330-8. Memory devices 330-5, ..., 330-8 can include non-volatile memory arrays and/or volatile memory arrays. Memory devices 330-5, ..., 330-8 can include control circuitry 332 (e.g., hardware, firmware, and/or software) which can be used to execute commands on the memory devices 330-5, ..., 330-8. Control circuitry 332 can receive commands from controller 320. Control circuitry 332 can be configured to execute commands to read and/or write data in the memory devices 330-5, ..., 330-8. For example, memory devices 330-5, ..., 330-8 can include storage class memory.

Controller 320 on DIMM 310-1 can be a memory system controller. A memory system controller can receive commands and/or data and determine where to send the commands and/or data. Controller 320 can receive commands from host 302 and/or DIMM 310-2 and determine that the commands are to be executed by DIMM 310-1 and/or DIMM 310-2. Controller 320 can control execution of the commands in response to determining where the commands are to be executed. Controller 320 can receive commands from host 302 and determine that the commands are to be executed using DIMM 310-2. Controller 320 can execute the commands to transfer data between DIMM 310-1 and DIMM 310-2 on bus 319 in response to determining the commands are to be executed using DIMM 310-2. Controller 320 can receive data from DIMM 310-2 from host 302 and determine that the data is to be stored on DIMM 310-2. Controller 320 can execute the command so the data is written on DIMM 310-2 via bus 319 in response to determining the data is to be stored on DIMM 310-2. Controller 320 can receive data from DIMM 310-2 via bus 319 and determine that the data is to be sent to host 302. Controller 320 can send the data to host 302 in response to determining the data is to be sent to host 302.

Figure 4A:
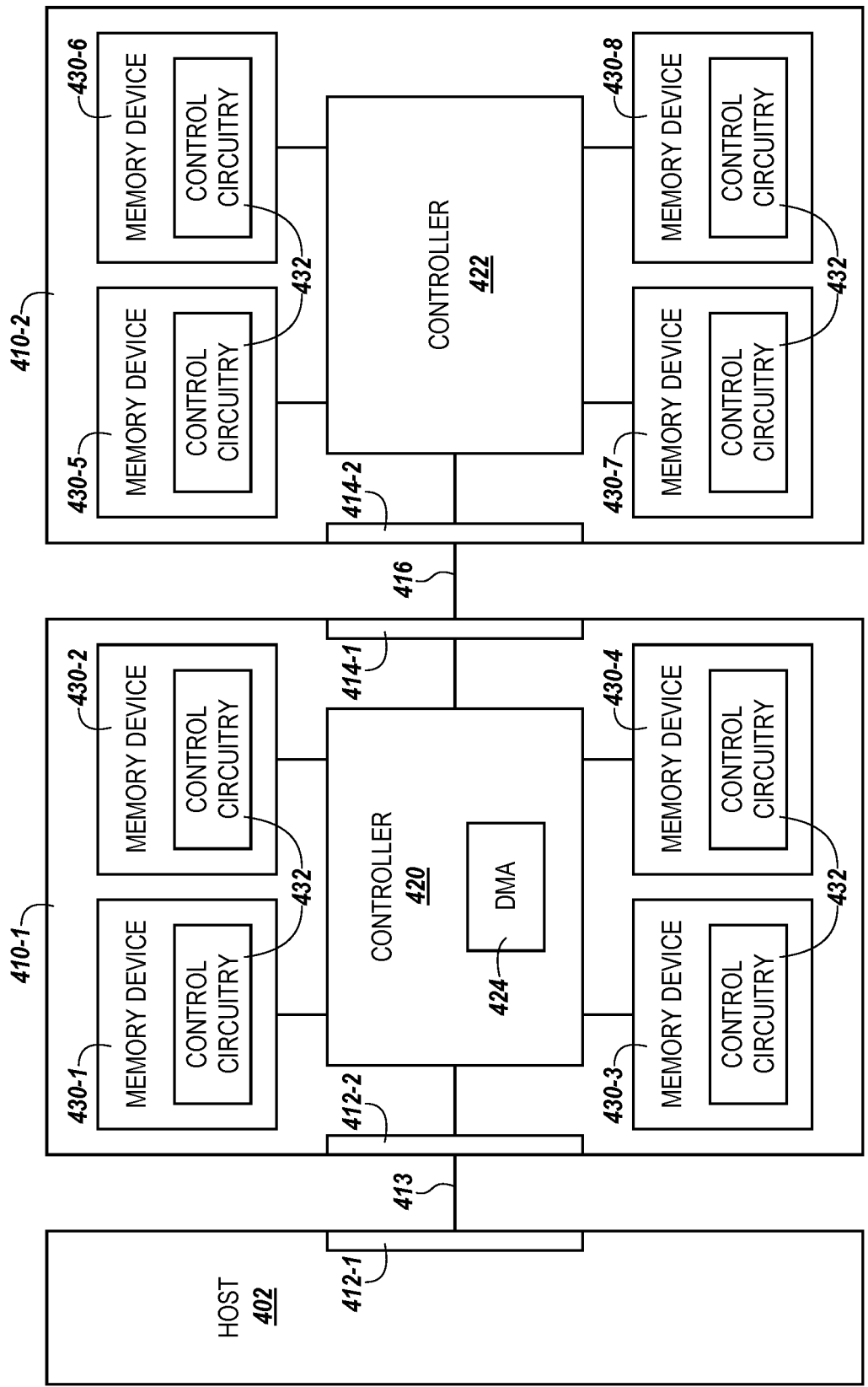
FIGS. 4A and 4B is a block diagram of an apparatus in the form of a computing system including a memory system having a memory module with a memory system controller and a direct memory access (DMA) module in accordance with a number of embodiments of the present disclosure.
Figure 4B:
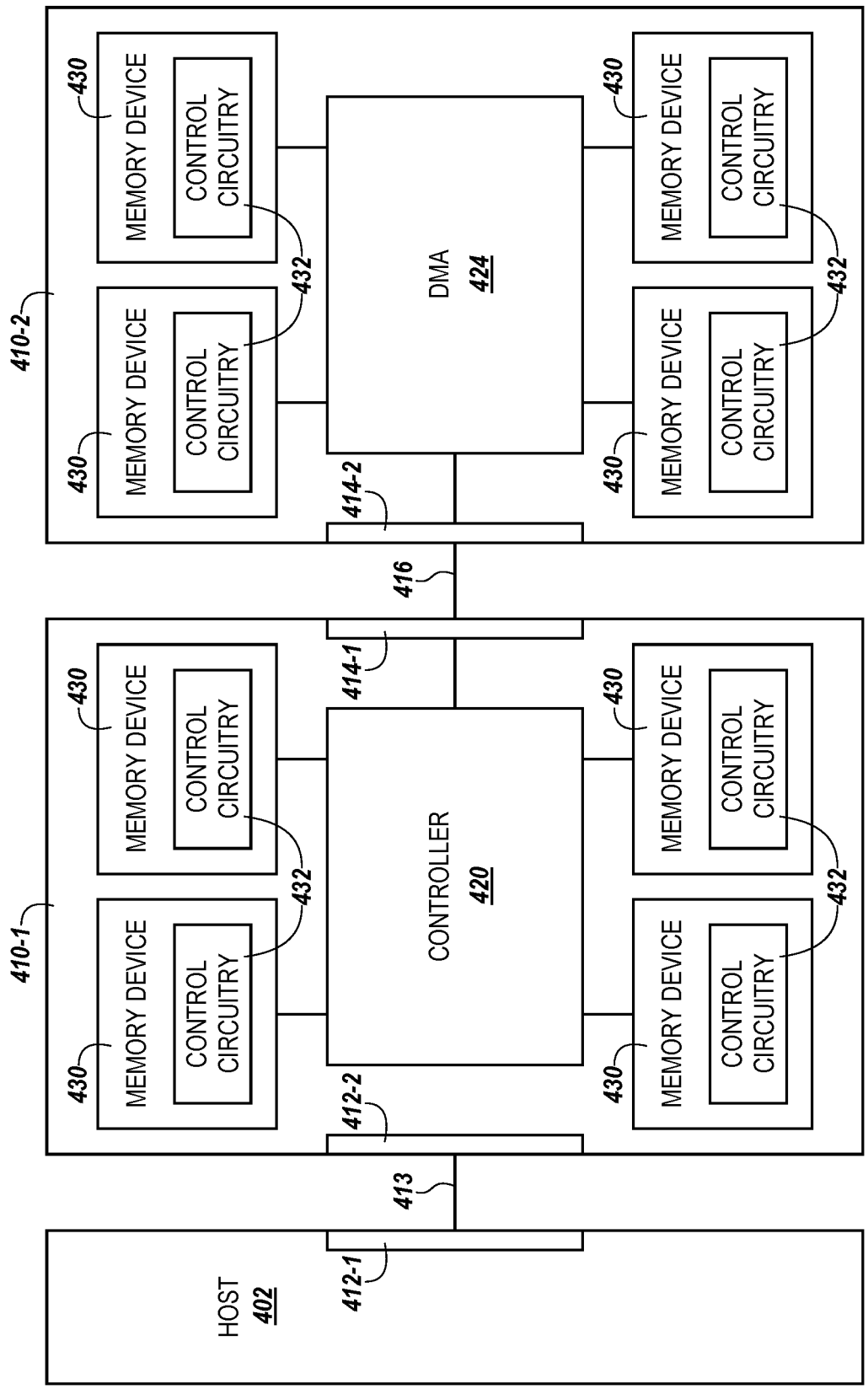

FIGS. 4A and 4B is a block diagram of an apparatus in the form of a computing system including a memory system having a memory module with a memory system controller and a direct memory access (DMA) module in accordance with a number of embodiments of the present disclosure. In FIG. 4A, host 402 is coupled to DIMM 410-1 via interface A 412-1, interface A 412-2, and bus 413. DIMM 410-1 includes controller 420 coupled to interface A 412-2. DIMM 410-1 includes memory devices 430-1, ..., 430-4 coupled to controller 420. Memory devices 430-1, ..., 430-4 can include non-volatile memory arrays and/or volatile memory arrays. Memory devices 430-1, ..., 430-4 can include control circuitry 432 (e.g., hardware, firmware, and/or software) which can be used to execute commands on the memory devices 430-1, ..., 430-4. Control circuitry 432 can receive commands from controller 420. Control circuitry 432 can be configured to execute commands to read and/or write data in the memory devices 430-1, ..., 430-4. For example, DIMM 410-1 can be an NVDIMM with memory devices 430-1 and 430-2 that include DRAM and memory devices 430-3 and 430-4 that include 3D X-Point memory.

DIMM 410-1 is coupled to DIMM 410-2 via interface B 414-1, interface B 414-2, and bus 416. DIMM 410-2 includes controller 422 coupled to interface B 414-2. DIMM 410-2 includes memory devices 430-5, ..., 430-8 coupled to controller 422. Memory devices 430-5, ..., 430-8 can include non-volatile memory arrays and/or volatile memory arrays. Memory devices 430-5, ..., 430-8 can include control circuitry 432 (e.g., hardware, firmware, and/or software) which can be used to execute commands on the memory devices 430-5, ..., 430-8. Control circuitry 432 can receive commands from controller 420. Control circuitry 432 can be configured to execute commands to read and/or write data in the memory devices 430-5, . . . , 430-8. For example, memory devices 430-5, . . . , 430-8 can include storage class memory.

Controller 420 on DIMM 410-1 can be a memory system controller. A memory system controller can receive commands and/or data and determine where to send the commands and/or data. Controller 420 can receive commands from host 402 and/or DIMM 410-2 and determine that the commands are to be executed by DIMM 410-1. Controller 420 can include direct memory access (DMA) module 424. Controller 420 can generate commands via DMA module 424 to perform DMA transfers of data from DIMM 410-2 to DIMM 410-1.

In FIG. 4B, host 402 is coupled to DIMM 410-1 via interface A 412-1, interface A 412-2, and bus 413. DIMM 410-1 includes controller 420 coupled to interface A 412-2. MINIM 410-1 includes memory devices 430-1, . . . , 430-4 coupled to controller 420. Memory devices 430-1, . . . , 430-4 can include non-volatile memory arrays and/or volatile memory arrays. Memory devices 430-1, . . . , 430-4 can include control circuitry 432 (e.g., hardware, firmware, and/or software) which can be used to execute commands on the memory devices 430-1, . . . , 430-4. Control circuitry 432 can receive commands from controller 420. Control circuitry 432 can be configured to execute commands to read and/or write data in the memory devices 430-1, . . . , 430-4. For example, DIMM 410-1 can be an NVDIMM with memory devices 430-1 and 430-2 that include DRAM and memory devices 430-3 and 430-4 that include 3D X-Point memory.

DIMM 410-1 is coupled to DIMM 410-2 via bus 419. DIMM 410-2 includes memory devices 430-5, . . . , 430-8. Memory devices 430-5, . . . , 430-8 can include non-volatile memory arrays and/or volatile memory arrays. Memory devices 430-5, . . . , 430-8 can include control circuitry 432 (e.g., hardware, firmware, and/or software) which can be used to execute commands on the memory devices 430-5, . . . , 430-8. Control circuitry 432 can receive commands from controller 420. Control circuitry 432 can be configured to execute commands to read and/or write data in the memory devices 430-5, . . . , 430-8. For example, memory devices 430-5, . . . , 430-8 can include storage class memory.

Controller 420 on DIMM 410-1 can be a memory system controller. A memory system controller can receive commands and/or data and determine where to send the commands and/or data. Controller 420 can receive commands from host 402 and/or DIMM 410-2 and determine that the commands are to be executed by DIMM 410-1. DIMM 410-2 can include direct memory access (DMA) module 424. Controller 420 can generate commands via DMA module 424 to perform DMA transfers of data from DIMM 410-2 to DIMM 410-1.

Figure 5:
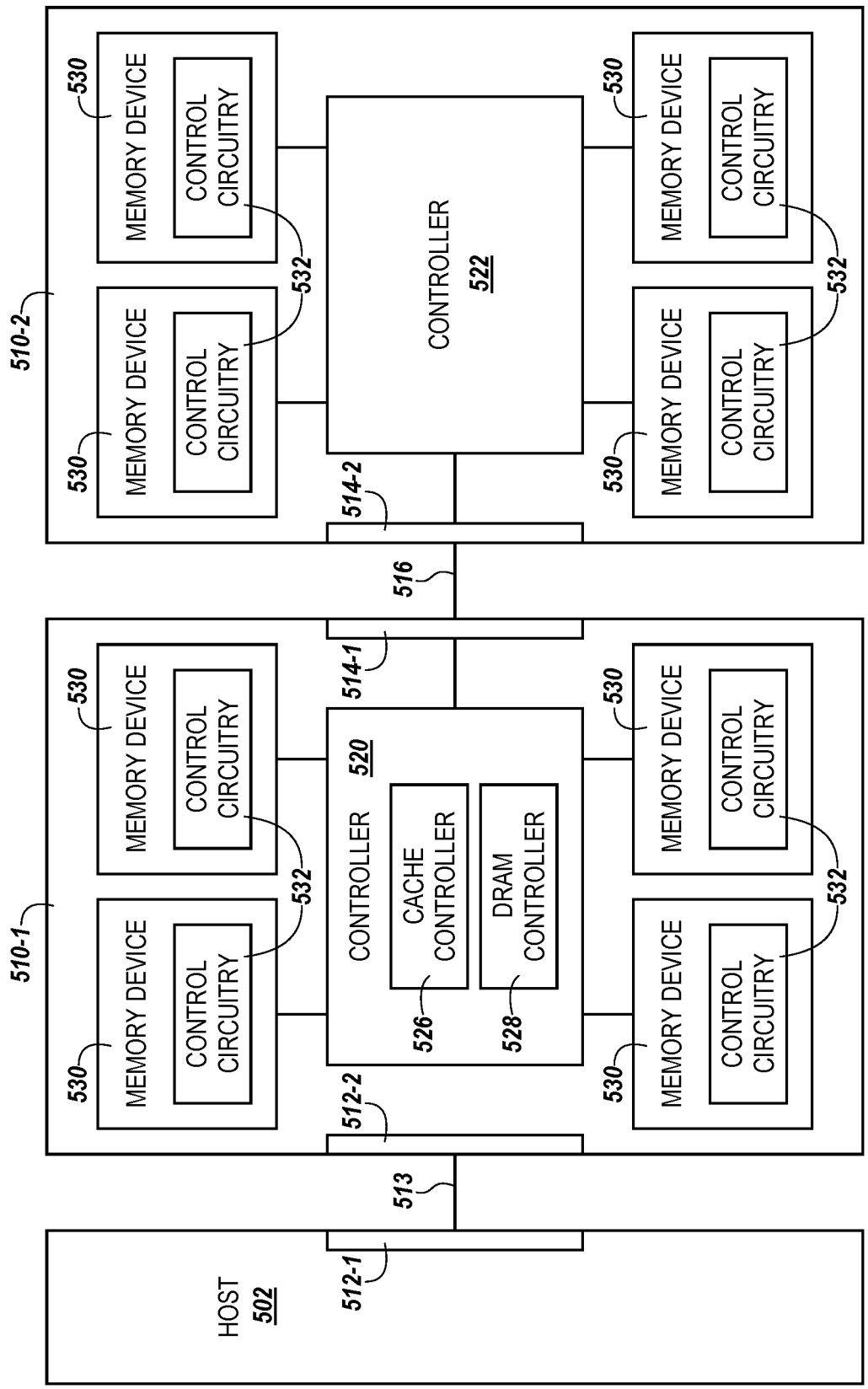
FIG. 5 is a block diagram of an apparatus in the form of a computing system including a memory system having a memory module with a memory system controller, a cache controller, and a DRAM controller in accordance with a number of embodiments of the present disclosure.

FIG. 5 is a block diagram of an apparatus in the form of a computing system including a memory system having a memory module with a memory system controller, a cache controller, and a DRAM controller in accordance with a number of embodiments of the present disclosure. In FIG. 5, host 502 is coupled to DIMM 510-1 via interface A 512-1, interface A 512-2, and bus 513. DIMM 510-1 includes controller 520 coupled to interface A 512-2. DIMM 510-1 includes memory devices 530-1, . . . , 530-4 coupled to controller 520. Memory devices 530-1, . . . , 530-4 can include non-volatile memory arrays and/or volatile memory arrays. Memory devices 530-1, . . . , 530-4 can include control circuitry 532 (e.g., hardware, firmware, and/or software) which can be used to execute commands on the memory devices 530-1, . . . , 530-4. Control circuitry 532 can receive commands from controller 520. Control circuitry 532 can be configured to execute commands to read and/or write data in the memory devices 530-1, . . . , 530-4. For example, DIMM 510-1 can be DDR5 DIMM with memory devices 530-1, . . . , 530-4 that include DRAM.

DIMM 510-1 is coupled to DIMM 510-2 via interface B 514-1, interface B 514-2, and bus 516. DIMM 510-1 includes controller 522 coupled to interface B 514-2. DIMM 510-2 includes memory devices 530-5, . . . , 530-8 coupled to controller 522. Memory devices 530-5, . . . , 530-8 can include non-volatile memory arrays and/or volatile memory arrays. Memory devices 530-5, . . . , 530-8 can include control circuitry 532 (e.g., hardware, firmware, and/or software) which can be used to execute commands on the memory devices 530-5, . . . , 530-8. Control circuitry 532 can receive commands from controller 520. Control circuitry 532 can be configured to execute commands to read and/or write data in the memory devices 530-5, . . . , 530-8. For example, memory devices 530-5, . . . , 530-8 can include storage class memory.

Controller 520 on DIMM 510-1 can be a memory system controller. A memory system controller can receive commands and/or data and determine where to send the commands and/or data. Controller 520 can include a cache controller 526 and a DRAM controller 528. DIMM 510-1 can be configured as cache for the memory system. Cache tags and data can be stored in memory devices 530-1, . . . , 530-4. Controller 520 can receive commands from host 502 determine, using the cache controller 526, whether data associated with the commands are located in cache (e.g., in memory devices 530-1, . . . , 530-4) based on the cache tag data. Controller 520 can send the data from devices 530-1, . . . , 530-4 to host 502 using DRAM controller 528 in response to the cache controller 526 determining that the data associated with the commands is a hit (e.g., cache tag data in devices 530-1, . . . , 530-4 matched tag data of the commands). Controller 520 can send the commands to DIMM 510-2 in response to determining that the data associated with the commands is a miss (e.g., cache tag data in devices 530-1, . . . , 530-4 does not match tag data of the commands). DIMM 510-2 can send the data to host 502 via DIMM 510-2 in response to receiving the commands from controller 520.

Figure 6:
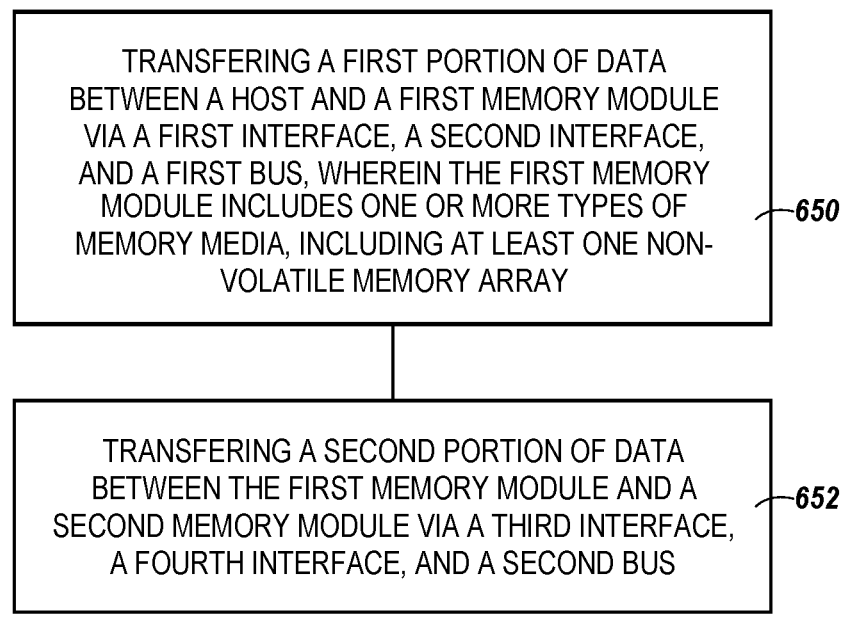
FIG. 6 is a flow diagram illustrating an example process using a memory module interface in accordance with a number of embodiments of the present disclosure.

FIG. 6 is a flow diagram illustrating an example method of using a memory module interface in accordance with a number of embodiments of the present disclosure. The process described in FIG. 6 can be performed by, for example, a memory system including a memory module such as DIMM 310 shown in FIG. 3.

At block 650, the method can include transferring a first portion of data between a host and a first memory module via a first interface, a second interface, and a first bus, wherein the first memory module includes one or more types of memory media, including at least one non-volatile memory array. The first memory device can be coupled to the host via the first bus that is at least partially located on a printed circuitry board.

At block 652, the method can include transferring a second portion of data between the first memory module and a second memory module via a third interface, a fourth interface, and a second bus. The first memory module can be coupled to the second memory module via the second bus that is not located on the printed circuit board. The first portion of data can be transferred while the second portion of data is being transferred.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
    a first memory module coupled to a host via a first bus on a printed circuitry board (PCB) and comprising one or more types of memory media;
    a second memory module coupled to the first memory module via a second bus off the PCB, wherein the second memory module is coupled only to the first memory module via the second bus; and
    an interface configured to transfer data, commands, or both, between the first memory module and the second memory module.

2. The apparatus of claim 1, wherein at least one of the one or more types of memory media comprises a non-volatile memory array.

3. The apparatus of claim 1, wherein the interface is configured to transfer data, commands, or both, in response to receiving a read request, a write request, or both.

4. The apparatus of claim 1, further comprising a different interface configured to transfer data, commands, or both, between the first memory module and the host in response to receiving a read request, a write request, or both.

5. The apparatus of claim 1, further comprising a different interface configured to transfer data, commands, or both, between the second memory module and the host in response to receiving a read request, a write request, or both.

6. The apparatus of claim 1, further comprising the second memory module coupled to a third memory module via a third bus.

7. A system, comprising:
    a host;
    a first memory module coupled to the host via a first bus on a printed circuitry board (PCB) and comprising one or more types of memory media, the first memory module configured to execute commands from the host to transfer data between the first memory module, a second memory module, and the host;
    the second memory module coupled to the first memory module via a second bus off the PCB, wherein the second memory module is coupled only to the first memory module via the second bus; and
    a first interface configured to transfer the data between the first memory module and the host in response to receiving a first read request, a first write request, or both; and
    a second interface configured to transfer the data between the first memory module and the second memory module in response to receiving a second read request, a second write request, or both.

8. The system of claim 7, wherein the one or more types of memory media comprises at least one non-volatile memory array.

9. The system of claim 7, wherein the first bus is couplable to a third interface on the host.

10. The system of claim 9, wherein the system is configured to transfer data between the host and the first memory module via the first interface, the third interface, and the first bus.

11. The system of claim 7, wherein the second memory module comprises a further interface and is coupled to the first memory module via the second interface, the second bus, and the further interface.

12. The system of claim 7, wherein the first memory module is an NVDIMM-P and the second memory module includes DRAM.

13. The system of claim 7, wherein the first memory module is an NVDIMM-P and the second memory module includes storage class memory.

14. A method, comprising:
    transferring a first portion of data between a host and a first memory module via a first bus located on a printed circuitry board (PCB), a first interface, and a second interface; and
    transferring a second portion of data between the first memory module and a second memory module via a second bus located off the PCB, a third interface, and a fourth interface, wherein the second memory module is coupled only to the first memory module via the second bus.

15. The method of claim 14, further comprising, transferring the first portion of data in response to receiving a read request, a write request, or both.

16. The method of claim 14, further comprising, transferring the second portion of data in response to receiving a read request, a write request, or both.

17. The method of claim 14, further comprising transferring the first portion of data while transferring the second portion of data.

18. The method of claim 14, wherein transferring the first portion of data and transferring the second portion of data includes executing commands from the host.

19. The method of claim 14, wherein transferring the second portion of data includes executing commands from the first memory module, the second memory module, or both.

* * * * *